(12) United States Patent
Mitchell

(10) Patent No.: US 7,783,316 B1
(45) Date of Patent: Aug. 24, 2010

(54) PUBLIC SAFETY COMMUNICATIONS NETWORK USING ASYMMETRIC RECEIVE/TRANSMIT CHANNELS

(75) Inventor: James P. Mitchell, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 1718 days.

(21) Appl. No.: 10/937,648

(22) Filed: Sep. 9, 2004

(51) Int. Cl.
| | |
|---|---|
| H04B 7/00 | (2006.01) |
| H04B 3/46 | (2006.01) |
| H04B 17/00 | (2006.01) |
| H04N 5/44 | (2006.01) |
| H04N 5/64 | (2006.01) |
| H04N 7/10 | (2006.01) |
| H04N 7/20 | (2006.01) |
| G01R 31/08 | (2006.01) |
| G06F 11/00 | (2006.01) |
| G08C 15/00 | (2006.01) |
| H04J 1/16 | (2006.01) |
| H04J 3/14 | (2006.01) |
| H04L 1/00 | (2006.01) |
| H04L 12/26 | (2006.01) |
| H04W 4/00 | (2009.01) |
| H04Q 1/20 | (2006.01) |
| H04M 13/00 | (2006.01) |
| H03M 13/00 | (2006.01) |

(52) U.S. Cl. .................. 455/521; 455/518; 455/519; 348/725; 348/837; 348/838; 370/230; 370/330; 375/227; 379/185; 714/783; 725/33; 725/35; 725/67

(58) Field of Classification Search .............. 370/316, 370/335, 340, 342, 465, 230, 330, 334; 455/521, 455/509, 417, 518, 12.1, 404.1, 404.2, 426.1, 455/431, 450, 552, 3.02, 407, 408, 519, 520, 455/FOR. 237, 556.1; 375/214, 227, 256, 375/295; 340/291, 521, 531, 539.17, 945, 340/512, 513, 533; 725/34, 63, 33, 67, 108, 725/10, 35, 64; 714/783; 348/14.08, 461, 348/614, 725, E5.084, E5.099, E7.025, E7.071, 348/E7.073, E7.093, 837, 838; 379/185
See application file for complete search history.

(56) References Cited

U.S. PATENT DOCUMENTS 5,517,510 A * 5/1996 Kuban et al. ................ 714/783
(Continued)

OTHER PUBLICATIONS

Patent Application for "Variable Rate Forward Error Correction Regulation System and Method Based on Position Location Information" by James P. Mitchell, filed herewith.
(Continued)

*Primary Examiner*—Andrew Wendell
*Assistant Examiner*—Paul P Tran
(74) *Attorney, Agent, or Firm*—Matthew J. Evans; Daniel M Barbieri

(57) ABSTRACT

A public safety communications network uses asymmetric channels for receiving requests for data from a mobile client over a narrowband land mobile radio system (LMRS) channel and delivering wideband data over a digital television (DTV) network channel to a DTV datacast receiver with the mobile client. An emergency operations center connected to the LMRS receives and processes the data requests and forwards the requested data. DTV network stations have a data multiplex insertion system for inserting the requested data into a DTV signal. The DTV network may be a public television network. An addressing system identifies unique mobile client addresses and unique mobile client group addresses and selects a DTV transmitter for delivering response messages in accordance with the addresses. A forward error correction (FEC) regulation system is used in transmitting requested data with FEC strength regulated as a function of historical bit-error-rate or receive power for a geographical location.

24 Claims, 4 Drawing Sheets

U.S. PATENT DOCUMENTS

| | | | | |
|---|---|---|---|---|
| 5,990,826 | A | | 11/1999 | Mitchell ..................... 342/357 |
| 6,160,852 | A | * | 12/2000 | Grube et al. ................ 375/256 |
| 6,188,353 | B1 | | 2/2001 | Mitchell ..................... 342/386 |
| 6,304,299 | B1 | * | 10/2001 | Frey et al. ................... 348/614 |
| 6,498,627 | B1 | * | 12/2002 | Hershey et al. ............. 348/725 |
| 6,529,706 | B1 | | 3/2003 | Mitchell ..................... 455/12.1 |
| 6,853,849 | B1 | * | 2/2005 | Tognazzini ................. 455/457 |
| 2003/0045231 | A1 | * | 3/2003 | Chapelle et al. ............ 455/12.1 |
| 2003/0086000 | A1 | * | 5/2003 | Siemens et al. ............. 348/148 |
| 2003/0093789 | A1 | * | 5/2003 | Zimmerman et al. .......... 725/34 |
| 2003/0217362 | A1 | * | 11/2003 | Summers et al. ............. 725/63 |
| 2005/0086334 | A1 | * | 4/2005 | Aaltonen et al. ............ 709/223 |

OTHER PUBLICATIONS

Patent Application for "System and Method for Real Time Textual Data Compression and Textual Data Manipulation Using Unique Numerical Identification of Entire Words" by James P. Mitchell, U.S. Appl. No. 09/660,013, filed Sep. 12, 2000.

Patent Application for "System and Method for Compression of Words and Phrases in Text Based on Language Features" by James P. Mitchell, Serial No. 824,923, filed Apr. 15, 2004.

Triveni Digital brochure for "SkyScraper Data Broadcast System for Digital Television", 2004.

"Data Transmission Efficiency" Harmonic Inc. White Paper, Feb. 24, 2003.

"Broadcast and Multicast Services in Mobile Networks", by K. Ahmavaara at al., XVIII World Telecommunications Congress 2002, Paris, France Sep. 22-27, 2002.

"IP Datacast in a Teracom DVB-T Network in Stockholm" Teracom White Paper, Jul. 2002.

"What Exactly is 8-VSB Anyway" paper by David Sparano, Harris Corp., first version 1997.

* cited by examiner

PUBLIC SAFETY COMMUNICATIONS NETWORK USING ASYMMETRIC RECEIVE/TRANSMIT CHANNELS

CROSS REFERENCE TO RELATED APPLICATIONS

The present application is related to co-pending application Ser. No. 10/937,686 filed herewith entitled "Variable Rate Forward Error Correction Regulation System and Method Based on Position Location Information" by James P. Mitchell. The co-filed application is incorporated by reference in its entirety and is assigned to the assignee of the present invention.

BACKGROUND OF THE INVENTION

The present invention relates to communications networks and specifically to an asymmetrical communications network that offers increased bandwidth for use in public safety applications. The present invention relates to all public safety related agencies and some related private agencies (FBI, NTSB, FAA, FEMA police, fire, EMS, sheriff, ambulance, national weather etc.) radio communications systems. The present invention also relates to national Home Land Defense (HLD) related incidents where multiple state and federal government public safety agencies may respond.

Current land mobile radio systems (LMRS) (VHF, UHF, and 800/900 MHz areas of the spectrum) are narrowband and do not offer any type of broadband reception to deliver desired broadband applications such as timely video, graphics, etc. Current systems mainly provide narrowband voice and some low-speed data traffic (e.g. analog and digital trunked radio systems). Narrowband radio channels are easily congested making video, graphics, or picture data impractical and potentially congesting the channels making them difficult to use for other critical voice or data traffic uses.

Additional bandwidth capability must be very low cost to the user at a remote end of the LMRS. Most large metropolitan areas have used FCC allocated bandwidth making it difficult to obtain more. Use and reuse of existing spectrum is sought. Some examples include reallocation of analog television bands.

Currently LMRS channel priority is handled by voice. No master plan to organize spectrum use in a timely fashion in the event of a regional disaster is provided. Public safety city and county jurisdictions purposely divide up non-overlapping frequency bands, making it difficult to quickly share important information efficiently during the event of a regional disaster. There is a need to more efficiently organize LMRS spectrum use issuing a broadcast simultaneously to all first-responders and agents. There is a need to improve interoperability between various city, county, state, and federal agencies.

Each county and major city in a state administration generally operates within a fiscal budget and each entity purchases LMRS radios on an as needed or as affordable standpoint. The resultant is highly disparate systems and system capabilities across all 50 states and across state lines that may not cross-communicate well when an incident calls for a multi-regional and multi-agency response. There is a need for public safety and HLD interoperable communications that offers affordable improved multi-jurisdiction and regional interoperability.

Emergency response teams desire better information, including graphical downloads of mug-shots, hazardous material info, building drawings for fire fighters, drivers license information, Amber Alerts, etc. Mug shot data is generally retrieved from the NCIC (National Crime Information Center) and there is currently no practical means of forwarding the graphical portions of that information from a dispatch center to an officer in a car. There is a need to request and deliver relevant graphical data to the mobile emergency response team receiver systems in a manner that reflects on the entire response team's command hierarchy at a developing emergency location.

Thus there is a need to improve interoperability by incorporating a broadband capability that is common with all agencies and regions that can instantly inform all emergency first responders and agents and assist in organizing inter-agency communications by providing realtime information on first responder radio band information and position location data on each responder in a graphical format.

SUMMARY OF THE INVENTION

A public safety communications network using asymmetric channels for receiving requests for data from a mobile client over a narrowband channel and delivering wideband data over a wideband channel to the mobile client is disclosed. The network comprises a land mobile radio system (LMRS) for providing the narrowband channel for requesting the data. The network has an emergency operations center (EOC) connected to the LMRS for receiving and processing the data requests and forwarding the requested data. A digital television (DTV) network provides the wideband channel and is connected to the EOC for delivering the requested data over the wideband channel. A DTV datacast receiver receives the requested data from the DTV network. A wide area network (WAN) interconnects the DTV network, the LMRS, and the EOC.

The EOC comprises a server for providing data compression, encryption, mobile forward error correction (FEC), addressing, and scheduling to the requested data. Databases are connected to the server to provide the requested data.

The LMRS further comprises a mobile LMRS radio located with the mobile client for requesting the data over the narrowband channel from a LMRS dispatch center. A computer located with the mobile LMRS radio is used for managing and displaying data received from the DTV network DTV datacast receiver. A GPS receiver is located with the mobile LMRS radio for reporting position. A LMRS dispatch center receives the data requests from the mobile LMRS radio and forwards the requests to the EOC.

The DTV network comprises DTV stations that have a data multiplex insertion system for inserting the requested data into a DTV signal and a RF/transmission system for transmitting the DTV signal. The DTV network may be a public television (PTV) network that includes PTV stations.

The public safety communications network has an addressing system for identifying unique mobile client addresses and unique mobile client group addresses and to select a DTV transmitter for delivering response messages to the unique mobile client and unique mobile client group in accordance with the address. The DTV transmitter is selected by using mobile client position determined from a GPS receiver and transmitted with the request.

The public safety communications network further comprises a forward error correction (FEC) regulation system for use in transmitting requested data to the mobile client wherein FEC strength is regulated as a function of historical bit-error-rate (BER) and receive power for a geographical location. The FEC regulation system may use a predictive BER feedback mechanism for FEC regulation based on mobile client position or predicted position. The FEC regulation system may use a table that cross-references mobile client position with a predetermined measured performance for a location, urban or rural for FEC regulation. The FEC strength may be varied by modifying packet payload redundancy. The FEC strength may be varied by changing an error coding rate to match the channel condition and to conserve channel bandwidth. The FEC strength may be varied by FEC redundancy frequency regulated by mobile client position feedback. The FEC strength may be varied by modifying interleave characteristics. The FEC strength may be varied by modifying Interleave time intervals to be non-equal. The interleave characteristics may be modified based on mobile client speed and location or predicted location. The location and predicted location of the mobile client may be RF surveyed in advance to gather RF fade statistics to determine needed FEC strength. The location of the mobile client may be determined through GPS or augmented geolocation reporting.

It is an object of the present invention to provide a public safety communications network using asymmetric channels for receiving requests for data from a mobile client over a narrowband channel and delivering wideband data over a wideband channel to the mobile client.

It is an object of the present invention to utilize various existing land mobile radio system (LMRS) options to provide the narrowband channel for requesting the data.

It is an object of the present invention to utilize a digital television (DTV) network for providing the wideband channel to deliver the requested data over the wideband channel.

It is an object of the present invention to provide a unique forward error correction technique to enable or improve mobile DTV signal quality.

It is an advantage of the present invention to be able to utilize existing Public Television (PTV) stations.

It is an advantage of the present invention to utilize unused state-wide PTV digital sideband assets.

It is an advantage of the present invention to provide a high data rate from DTV transmitters to enable better timeliness and quality of information service.

It is a feature of the present invention to provide high reliability and redundancy for statewide public service communications.

It is a feature of the present invention to provide the mobile and stationary capability to receive Amber Alerts, graphical data, photos, crime records, maps, weather information, municipal utility information, airport information, hazardous material information, and building drawings pertaining to an emergency situation.

It is a feature of the present invention to provide Interoperability across public safety disciplines, geography, and all levels of government.

BRIEF DESCRIPTION OF THE DRAWINGS

The invention may be more fully understood by reading the following description of the preferred embodiments of the invention in conjunction with the appended drawings wherein.

DETAILED DESCRIPTION

The invention described herein is for a public safety and homeland security communications network using asymmetric receive and transmit channels. The system is an asymmetrical hybrid communications system using digital television (DTV) assets such as the Public Television (PTV) network for delivering wide bandwidth data and land mobile radio systems (LMRS) for making narrow bandwidth requests to receive the wide bandwidth data at a mobile client. The asymmetric communications system has the ability to efficiently provide data broadcasts, alerts, graphics, and video transmission and retrieval to the mobile client. The mobile client may be any vehicular system or any system for a person on foot. The system provides efficient communications channel use by using a unique forward error correction (FEC) regulation system that includes vehicular motion and absolute position parameters as given by GPS or any other geolocation system including augmented and hybrid positioning schemes. This invention can also be used for high-value commercial purposes such as data and television delivery to passenger vehicles, industrial, aviation, or government vehicles.

Television station data broadcasting technology has been available for decades to analog broadcasters, generally integrated as part of the vertical blanking interval. The analog approach offers a means for delivering data, however for bandwidth reasons practical data rates are usually limited to the 19-kbps range.

High definition television (HDTV), after nearly a decade of development, has reached the point of commercialization with mandatory changeover per an FCC mandate by 2006 and implementation according to ATSC (Advanced Television Systems Committee) standards by all broadcasters. The selected U.S. ATSC digital standard uses 8-VSB modulation and enables maximum coverage for both digital video and high-speed ancillary data. Most HDTV equipment being installed includes a data casting capability or a data injection option. A typical digital television (DTV) station has a HDTV transmitter that is capable of a standard 19-Mbps video transmission. Of the total 19 Mbps, an average of 2 Mbps is available continuously and is not considered part of the video channel. An additional amount is available during moments of low MPEG-2 encoding traffic. Availability of the latter portion depends on statistical aspects of the video channel. Data rates reaching an additional 17 Mbps are available if the video area is allowed to be sacrificed for a total of 19 Mbps. This action requires significant coordination with the DTV station as it eliminates video subchannels or the high-definition channel. The new digital broadcasting standard, ATSC Standard A/53, provides the broadcaster with avenues to use data injection at the more favorable rates described above. DTV station owners are currently exploring the new data-casting capability.

Figure 1:
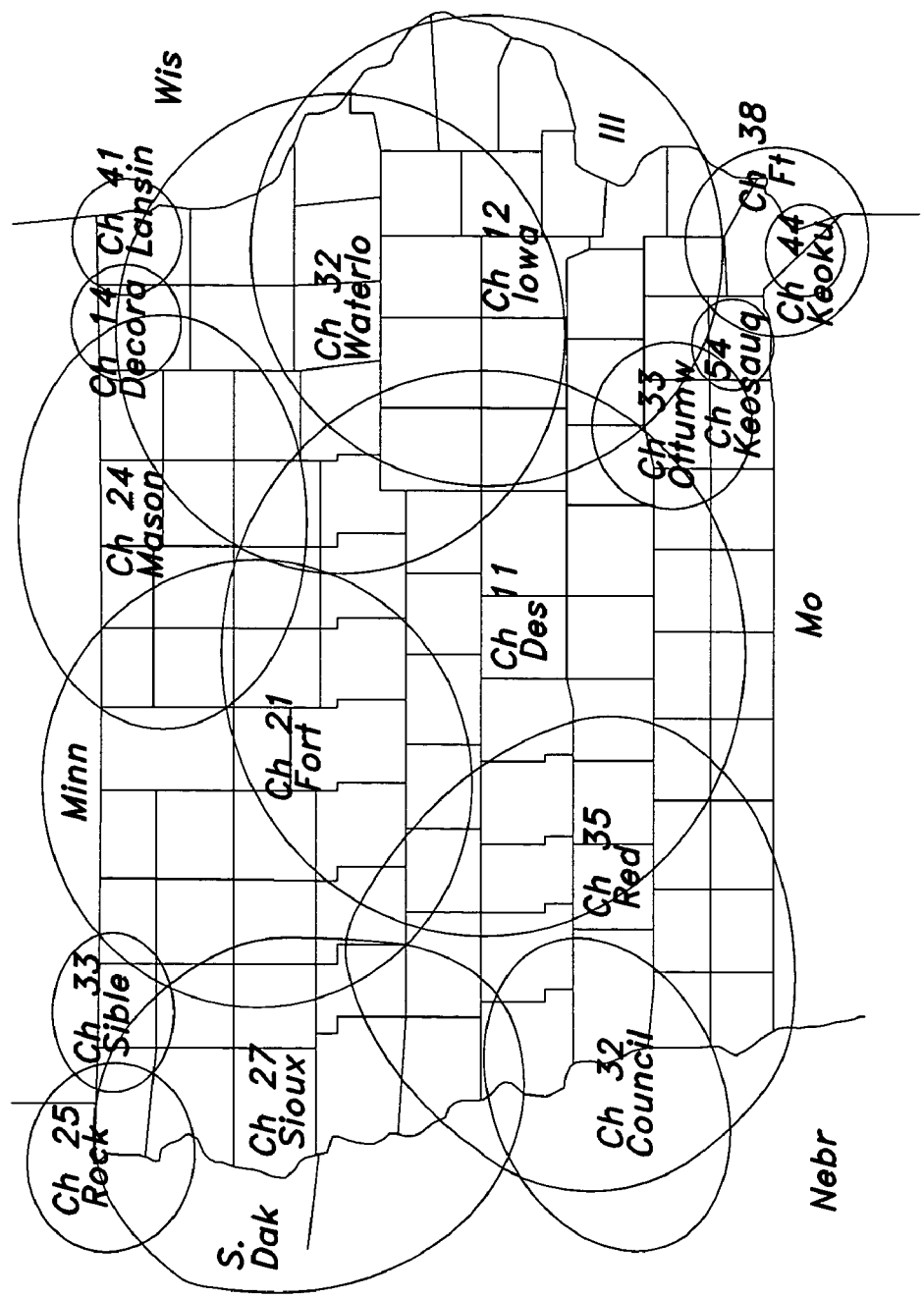
FIG. 1 is a map showing Public Television Network state-wide broadcast coverage of Iowa.

The National Public Television Broadcast Network with national headquarters in Washington, D.C. provides extensive coverage using 349 stations in all 50 states. The PTV network provides state-wide broadcast coverage in most states with Iowa's coverage being about 95% as shown in FIG. 1. Many of the PTV stations are now converting to the digital broadcast capability.

The invention encompasses the idea of using the national PTV network for delivering wideband data and alerts for public safety and home land security purposes. Commercial and other DTV networks may also be used. For example DOT images or enhanced Amber Alerts with photo identification can be simulcast nationwide through the digital PTV network to mobile clients. Alternatively alerts of any kind may be selectively delivered to any region covered by PTV. Public safety officials can request by voice or a mobile data terminal through a handheld or vehicular radio graphical data such as a mug shot or any image. The NCIC (National Crime Information Center) system is networked to this request and the relevant NCIC graphic photo is then encrypted and sent over the entire state or a selected region via Public Television's digital sideband. Information sent over the digital sideband may be encrypted and made not viewable by a home TV system as it lacks the ability to capture this type of data. The transmission of digital data over HDTV is being implemented or currently exists but has not had many strong uses in most states.

Existing land mobile radio systems used for public safety currently comprises mostly narrowband radios that are generally used for voice and limited data communications. In the present invention these radios are used to provide a back channel for mobile requests for graphical related information or other data from headquarters. The radios need not be modified for providing the back channel and may continue to be used for voice and narrowband purposes. For this invention, the PTV network is utilized as a return communications path to deliver video, data, or voice to the mobile client requestor and others if desired. The digital sideband is used to deliver the requested graphics data such as mug shots, DOT driver's license info, NCIC data, and future situational awareness diagrams of disaster scenes such as a graphic or map showing who is at the disaster scene, what frequency they are on and their position location on a map.

Figure 2:
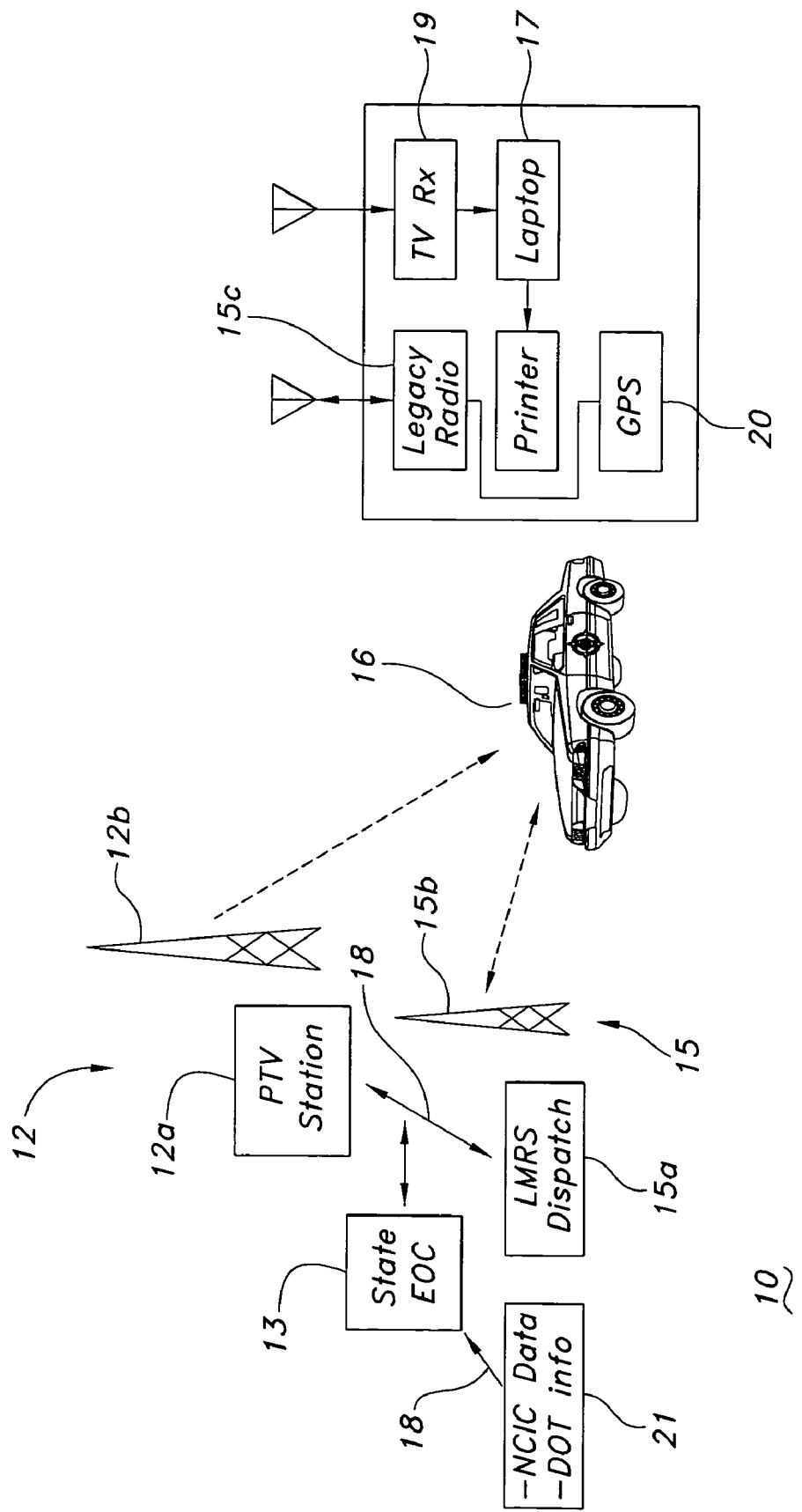
FIG. 2 is a block diagram of the public safety communications network using asymmetric receive/transmit channels of the present invention showing details of mobile client equipment.

FIG. 2 is a block diagram of the public safety communications network 10 using asymmetric receive/transmit channels of the present invention showing details of mobile client vehicle 16 equipment. The public safety communications network 10 comprises the PTV network 12 or other DTV network that includes a PTV or DTV station 12a and antenna 12b; the land mobile radio system 15 comprising a LMRS dispatch center 15a, a repeaters/antenna 15b, a legacy mobile radio 15c in vehicle 16, and handheld radios (not shown); and optionally a state emergency operations center (EOC) 13. The PTV network 12, the LMRS 15, and the EOC 13 are all interconnected with a wide area network (WAN) 18 that may be a wireless datalink, a fiberoptic data link, or some other high-speed data link. Each vehicle 16 is equipped with a computer 17 that may be a laptop computer that manages, decrypts, and displays data received from the PTV network 12 over a DTV datacast receiver 19. The DTV datacast receiver 19 is an addition to the vehicle 16. Receiver 19 may include multiple antenna and multiple receiver subsystems to improve mobile reception in a high multipath environment. Data from separate receivers tuned to the same channel may be fused together or voted on to produce a single data output. The envisioned public safety communications network 10 enables reuse of the existing LMRS 15, GPS receiver 20, and laptop computer 17 in the vehicle 16 as interface terminals.

In operation of the asymmetrical public safety communications system 10, a request for data is sent over the LMRS 15 from a requestor in the vehicle 16 using the legacy LMRS radio 15c, received by the antenna 15b, and the LMRS dispatch 15a. The request may originate from a mobile client other than a vehicle 16 when the mobile client is similarly equipped. The request is authenticated and vectored to the EOC 13. Databases 21 are connected to the EOC 13 to provide and forward the requested data over the wide area network 18. At the EOC 13, the data is compressed and encrypted and delivered with position-based forward error correction to the DTV stations 12a. Alternately the request may be forwarded from the LMRS dispatch 15a directly to the DTV station 12a when the LMRS dispatch 15a or the DTV station 12a have the capabilities of the EOC 13 thereby bypassing or eliminating the EOC 13. At the DTV station 12a the data is delivered to a data multiplex insertion system (shown in FIG. 3 as item 34) for transmission over the antenna 12b to the vehicle 16. The mobile client requestor of the data is notified of return data on the laptop computer 17 that is connected to the digital TV datacast receiver 19 located in the vehicle 16.

Figure 3:
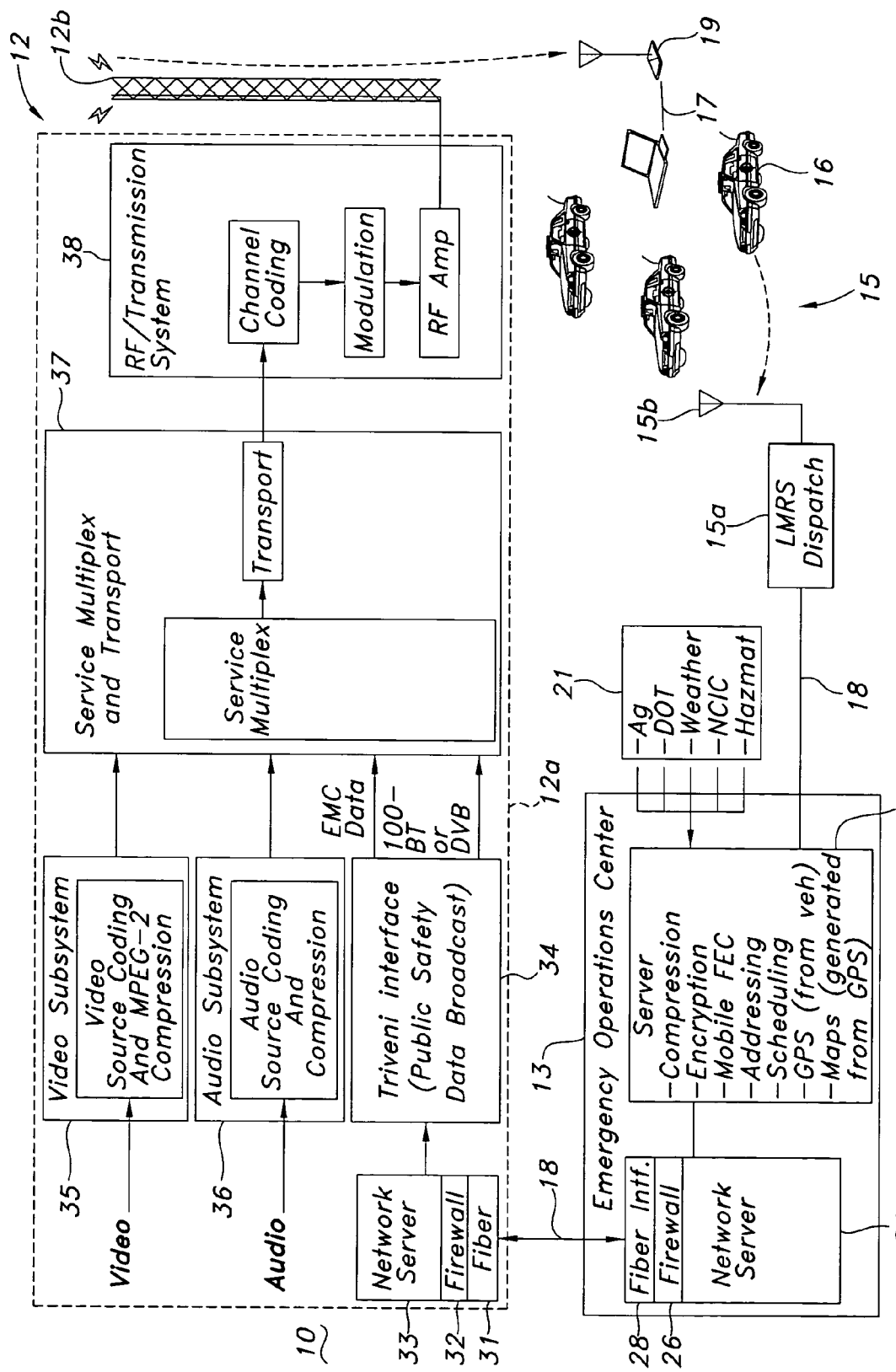
FIG. 3 shows the public safety communications network using asymmetric receive/transmit channels of the present invention with details of an emergency operations center and a digital television station.

The public safety communications network 10 using asymmetric receive/transmit channels of the present invention is shown in FIG. 3 with additional details of the EOC 13 and the DTV station 12a. The EOC 13 is connected to the LMRS 15 through the WAN 18 and to the databases 21 such as Department of Agriculture, Department of Transportation (DOT), weather, National Crime Information Center (NCIC), Hazmat, and any others needed for public safety and HDL applications through a database management system with databases located at each agency and a central management system at the EOC 13. The data from these databases 21 may be compressed (text and graphical) in advance of transmission using compression methods disclosed in co-pending application Ser. No. 09/660,013 "System and Method for Real Time Textual Data Compression and Textual Data Manipulation Using Unique Numerical Identification of Entire Words" by James P. Mitchell and Ser. No. 10/824,923 "System and Method for Compression of Words and Phrases in Text Based on Language Features" by James P. Mitchell. The co-pending applications are assigned to the assignee of the present invention.

The databases 21 and LMRS dispatch 15a are connected to a server 22 that provides real time data compression and encryption for the data from the databases 21. A real-time video encoder (not shown) such as a V-Brick VBXcast provides MPEG-4 conversion of analog video.

The public safety communications network 10 has an addressing system for identifying unique user individual addresses and unique user group addresses and to select a' DTV station 12a for delivering response messages. A group or individual address is placed in a data header or footer by the laptop computer 17 when a request is made from a vehicle 16 or other mobile client to server 22 over the LMRS 15. The address is used to send a response message to the group or individual mobile client 16 making the request. Messages may be sent to selected group or individuals without a request when necessary. A unique DTV transmitter's address is attached to the response message by the server 22 and sent over the WAN 18 enabling only a regional DTV station 12a necessary to reach the intended mobile client 16 or group of mobile clients rather than using entire PTV network 12 for broadcast. The unique DTV station 12a is selected by using mobile client position location determined from the GPS receiver 20 and transmitted with the request from the mobile client vehicle 16.

In the server 22 a forward error correction (FEC) algorithm for mobile datacast users is applied or alternatively a receipt acknowledgment protocol capable of working with the asymmetrical LMRS 15 and PTV system 12 is used. The FEC algorithm is described in greater detail below.

The EOC 13 further comprises a network server 24 that performs network management functions such as client authentication and query of agency databases. The network server 24 is connected to a firewall 26 for system protection and a fiberoptic interface 28 to interface the WAN 18 or other types of data communications networks as needed.

The DTV station 12a comprises a fiberoptic interface 31 to interface a fiberoptic WAN 18 or other types of networks as needed. A firewall 32 may be provided for system protection. The data from the WAN 18 is passed to a DTV network server 33. The DTV network server 33 prepares and schedules data for broadcast. This process can include forward error correction at the source code level, time interleave, and redundancy prescribed according to the mobile client position as correlated to a database linking position to a recommended FEC or error control method. The DTV network server 33 is connected to a data multiplex insertion system 34 such as one provided by Triveni to support a 2- to 4-Mbps data transmission capability for public safety data. The data multiplex insertion system 34 inserts public safety data requested from the mobile client vehicle 16 into a service multiplex and transport function 37 along with video data from a video subsystem 35 and audio data from an audio subsystem 36. Audio subsystem 36 and video subsystem 35 source code and compress the normal DTV data as part of the normal DTV function. The service multiplex and transport function 37 multiplexes the public safety data and the audio and video data and transports the multiplexed data to a RF/transmission system 38. In the RF/transmission system 38 channel coding, modulation, and amplification take place before a HDTV signal is sent to the antenna 12b for transmission to the mobile client vehicle 16 making the request along with a normal DTV signal.

The DTV datacast receiver 19 in the vehicle 16 is a broadband receiver such as one manufactured by BroadBand Tech Inc. for receiving DTV datacast messages. The DTV datacast receiver 19 includes application software enabling review or redistribution of information received including graphics, text, video and sound. The DTV datacast receiver 19 performs decompression of data, printer and video display functions, and electronic recording in memory for evidence courtroom use.

The asymmetrical public safety communications network 10 is inherently capable of supporting typical response times under 15 seconds provided the vehicle 16 has access to both the DTV and the LMRS links. The LMRS 15 may be used a backup return channel for data at a much reduce data rate in the event PTV system 12 is not available.

Currently there are very few if any practical options for realtime forward error correction (FEC) rate control in the asymmetric public safety communications network 10 using DTV system 12 to broadcast to the mobile client 16 and LMRS 15 to receive messages from the mobile client 16. Continuous DTV channel measurements may be reported using the LMRS 15. However it is highly undesirable to use a valuable and many times congested LMRS 15 as a continuous or periodic connection for reporting the DTV channel conditions or as a frequent ARQ (automatic retransmission request) channel. Land mobile radio bands are a scarce commodity and must remain open for vital voice communications. Thus there is a need for providing reception quality data feedback on the DTV broadcast channel without placing an undue traffic burden on the LMRS 15.

Additionally for reporting channel conditions the narrowband back channel LMRS 15 contains a significant amount of network latency by design. This poses a problem for a system that uses interleave techniques under mobile conditions in urban canyons as an example. With current FEC methods, there is no provision to provide a mobile client vehicle 16 dynamic FEC needs as it moves about. A mobile client 16 may be headed for an area having high LOS (line-of-sight) blockage conditions. With current day methods, the signal becomes blocked or compromised first and this information is fed back to a transmitter. FEC adjustments are reactive in this case and can result in high channel inefficiency and poor performance particularly if the feedback channel is relatively slow. In this case the signal may become blocked or attenuated and a new interleave and data payload redundancy is desired. However in the asymmetric communications system case, the LMRS 15 may take tens of seconds at best to inform the DTV system 12 to use a stronger redundancy and interleave time period for example but this is too slow and not enough benefit to justify LMRS 15 use as the mobile client 16 moves about. This is inefficient use of both the DTV and LMRS channels. FEC rates need to be regulated or controlled in a more predictive improved realtime manner for terrestrial asymmetric DTV/LMRS systems in order to make efficient use of the channel while maintaining a robust link.

A unique mobile forward error correction (FEC) regulation system may be used in the public safety network 10 in transmitting requested data to the mobile client vehicle 16. The FEC regulation system is based on prior knowledge of what the channel statistics are probably like in a particular geographic area. Rather than relying on slow and expensive return channels such as the LMRS 15, a proactive FEC channel adjustment is made according to the mobile client vehicle 16 position and anticipated path as determined by GPS, kinematic algorithms, and map and bit-error-rate databases. The FEC regulation system makes use of the asymmetric radio communications system 10 using the DTV system 12 and LMRS 15 and alternatively other radio system combinations may be used for the asymmetric design such as cellular and satellite.

In the FEC regulation system a predictive algorithm is used to arrive at a FEC based on vehicle 16 position and predicted position and historical bit-error-rate (BER) data or other channel performance statistic measured by the vehicle 16 over a period of time. Optionally a table that cross-references vehicle 16 position or predicted position with a previously surveyed or measured BER or other channel performance statistic for the position, urban or rural may be used to arrive at a FEC strength.

In the FEC regulation system, a map database and the predictive algorithm are used to generate an FEC method and strength for the mobile client 16 in a geographic location as a function of historical BER or other channel performance statistic stored in a BER database at the EOC 13 when the EOC 13 is used. A record of signal strength, multipath, and BER is accumulated historically for a period of time in the vehicle 16, giving probable or predictive indication as to what the future might have in terms of propagation. The historical bit-error-rate data accumulated in the vehicle 16 is sent to the EOC 13 during a mobile data request from the vehicle 16 to formulate a FEC coding, redundancy method, transmission repetition, and time interleave period. The map database and the predictive algorithm are used in identifying likelihood estimations of future paths of the mobile client's route. An assigned FEC method and strength is used with a data payload for broadcast over the DTV broadcast network 12 to the mobile client 16. For example, in geographical areas having occasional signal blockage such as hills or in rural areas a long data interleave might be selected, whereas in a city where there are high RF fade densities a high-rate block code may also be selected for the FEC in addition to an interleave. The FEC is selected based on the vehicle 16 geolocation and speed.

The map database may be a GIS (Geographic Information System) database used by a variety of public and private agencies to store and manipulate data about specific locations in a certain area. A geographic area such as a city has a digitized base map with known boundaries, landmarks, etc. stored in the GIS map database.

Figure 4:
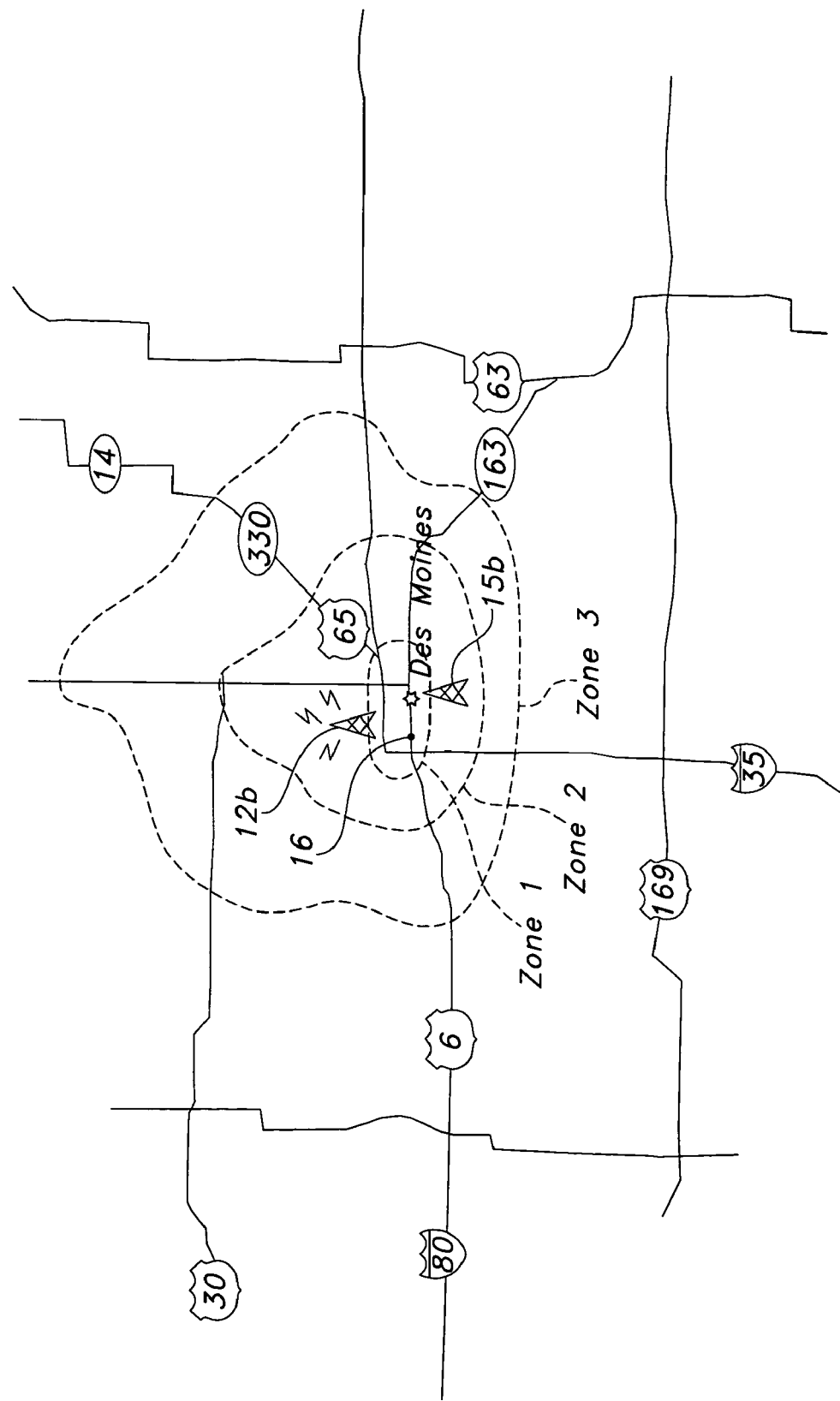
FIG. 4 shows operation of a forward error correction regulation system with the position of a mobile client being correlated to a historical bit error rate database for an area around Des Moines, Iowa.

Operation of the FEC is shown in FIG. 4 with the position of the mobile client 16 being correlated to the historical BER database for an area around Des Moines, Iowa. The unique broadcast FEC is dynamically constructed based on mobility status of the vehicle 16. A request for data from a vehicle 16 to the EOC 13 through the LMRS 15 over antenna 15*a* includes vehicle 16 mobility parameters such as GPS position, speed, and time to optimally construct FEC strength in the server 22 for transmitting the response from DTV station 12*a* over antenna 12*b*. In FIG. 4 Zone 1 has a high fade rate due to city buildings and a strong FEC, interleave, or redundancy is used. In Zone 2 a medium fade rate exists with some buildings a vehicular blockage requiring a medium FEC and redundancy. Zone 3 has a low fade rate with high blockage due to hilly terrain requiring a strong interleave and redundancy. Furthermore, the FEC redundancy might be regulated to a higher strength while the vehicle 16 is moving and minimal strength while the vehicle 16 is approximately stationary as determined by the GPS sensor 20 and transmitted over the LMRS 15 back channel. The server 22 may also schedule in advance updated FEC methods for subsequent data payloads for anticipated position location of the mobile client 16 as the client moves. Transmit server software anticipates vehicle location in order to create an optimized interleave sequence for that area.

In contrast, the cellular phone industry and other radio makers use continuous channel measurements to regulate FEC. The difference is that the system 10 of the present invention is mostly broadcast and has no continuous channel in which to maintain continuous link quality (LQ) measurements therefore a means for estimating it is needed.

With the optional database a RF fade/BER measurement database located in the EOC 13 is provided by a previous field survey of RF fade or other channel performance statistics in an area of interest and is used to generate an FEC method for the mobile client 16 in a geographic location and predictive modeling is used to assign FEC variations based on a RF reception history model for that location and mobile client 16 predicted forward motion. Absolute GPS or received GIS data may automatically be used and attached to the vehicle 16 data request, whereby the server 22 accepts the geolocation and by the RF fade/BER measurement database provides the appropriate FEC strength for that vehicle 16 at the GPS determined location.

In the generation and use of the RF fade/BER measurement database semi-permanent information is collected in a prior mobile BER field collection test. A city may be surveyed street by street of its fade and field strength statistics or other channel performance statistics important in understanding the probability of receiving good data. Statistical fade conditions may be predicted based on the vehicle 16 position, apparent or planned direction, and speed while on a particular road based on what comes next in the table while going in a certain direction on the road. The solution may be simplified by the fact the vehicle 16 stays on the road and predictive computing need only solve for a simple one-dimensional solution. In contrast fading may be predicted by using adjacent measurements to an area not having been RF fade surveyed before. Each mobile client vehicle 16 may also optionally incorporate a fade statistics table that is correlated to its position. The variable FEC regulation system may then regulate the data payload redundancy in the transmission, FEC coding rate, or use a temporal data interleave process that is regulated to nominal fade frequency conditions.

Collection of RF statistics over a geographic region may be manual or automated. A field survey of an area may be made with an automated system incorporated in the vehicle 16 consisting of the GPS receiver 20, DTV datacast receiver 19, a data demodulator, and measurement equipment allowing automated collection of DTV field strength and BER performance to create the semi-permanent database that is correlated to absolute geolocation (streets and highways, bridges, parking garages, etc.). The server 22 in association with the DTV station 12*a* may be used to transmit data sequences or random information that may be used to assess BER from data collected from mobile vehicles 16 with the automated system. Database tables are then maintained at the EOC 13 and may optionally be updated by mobile client vehicles 16 as they call in through the LMRS 15. Mobile client vehicles 16 may also accumulate historical RF fade and BER statistics based on position to improve the tables. This historical information may also be transmitted with a LMRS 15 request or by other means such as cellular phone or other radios. This history may be processed by the server 22 to further assess FEC needs.

Some DTV stations 12*a* have collected signal strength data for their geographic areas of signal coverage using equipment such as a Z Technology RF survey system. This data may be used for the field survey data or to augment the data. A RF signal strength system may be used to sample the DTV carrier.

With the FEC regulation system, FEC is obtained by packet payload redundancy, packet time spreading, and interleaving techniques known in the art. FEC strength may be varied by modifying the transmit payload redundancy and/or interleaving time intervals. Broadcast frame or packet sizes may also be selected based on conditions. Interleave time intervals may be non-equal in order to improve chances of delivering data in channels with varying fade conditions. FEC strength may be varied by changing the error coding rate (e.g. ½, ⅔ etc.) to best match the channel condition and to balance the need to conserve channel bandwidth. The variable FEC strength may be made related to seasonal foliage condition estimates and estimated conditions of wet foliage based on regional rain fall and evaporation rates.

FEC redundancy frequency may be regulated by GIS position location feedback taken from the vehicle 16 during the last contact or continuously. GPS position data may be used to compute line-of-sight or link loss when used with geographic information for that region. Redundancy frequency is defined by how often a packet is repeated. For example the location of the vehicle 16 may suggest that a redundancy of 6× is required such as in a heavy fading location in an urban area. The redundancy number is derived for a location based on signal to noise ratio (S/N) and/or BER measurements and includes the likely continued path of that vehicle 16.

The interleave characteristics may be selected based on the areas' fading statistics. For example a long or short interleave may be chosen based on vehicle 16 speed and location or predicted location of that vehicle 16. Additionally a variety of interleave time spans may be concatenated to produce an effect that improves received BER in an area having a variety of fade mechanisms. Fades that historically occur rapidly over time require a shorter interleave time period. Fades that occur more slowly signal the server 22 to select a shorter time interleave for the data stream. Fade situations that are occurring relatively longer and more frequently direct the server 22 at the EOC 13 to use more redundancy along with the interleave.

The asymmetric communications system 10 may employ an optional ARQ or ACK/NAK protocol when FEC fails in important transmissions. The land mobile radio system 15 may also be used to report back to the vehicle 16, the transmission of the DTV broadcast is complete. This is to acknowledge receipt at the vehicle 16. If receipt is negative at the vehicle 16 then a retransmission of selected failed packets or data may be made with a programmable number of retries and at specified intervals until transmission is complete, on hold until a significantly later time or abandoned. The DTV data packet broadcasts may be made redundant over varying periods of time (short and long intervals).

Position location systems that may be used in the asymmetric communications system 10 may include GPS, inertial navigation, MEMS (micro electromechanical system) sensors, RF position tags (such as disclosed in U.S. Pat. No. 5,990,826 and No. 6,188,353 both entitled "Interbuilding and Urban Canyon Extension Solution for Global Positioning Systems" by James P. Mitchell and both assigned to the assignee of the present invention), gyros, ring laser gyros, and other TDOA (time difference of arrival) systems including systems that are part of another network such as cellular, 3-G, cell phone TDOA systems, E-911, broadband, and UWB (ultra wideband communications and navigation systems). These and other systems or future positioning systems may be used alone or in hybrid fashion in order to improve position location accuracy and thereby accuracy of the asymmetric communications system 10 of the present invention.

All position locations referenced herein may optionally employ IPv6 (Internet Protocol Version 6) addressing, where addressing may be correlated (assigned) based on users position, region, and locale to a broadband service. IPv6 employs greater capacity to assign IP addresses to areas including mobile applications. Position location may determine the FEC that is used and also be used as a means for assigning an IP address for a broadband service nearby or alternatively as part of any position location RF tag or device.

Position location information delivered to the DTV broadcast system 12 may be used to select the encoding rate of H.2xx, MPEG-2 and MPEG-4 video. The RF statistics for a given geolocation position may provide RF statistics that an algorithm uses to select the video encoding rate for the mobile client 16. If the RF statistics are relatively good then a MPEG-2 video rate is selected to match that channel condition (4 Mbps) and is encapsulated in a FEC, and interleaved to fit channel conditions. It is noted that these levels are well published by radio and encoder equipment vendors and described in video coding texts.

There is a difference between commercial and government use of the system 10 in that a territory of operation is may not be friendly to make a preliminary RF survey. In this case propagation models must be used to estimate the link margin given computed interference (e.g. hill blocking DTV station 12a and vehicle 16 from direct line-of-sight). A digital terrain map (3-D) with elevations is captured or provided from the map database. Position data from a roving vehicle 16 is also captured. Based on propagation models a FEC method is selected and modified on a ongoing basis or as needed or based on empirically collected RF bit-error-rate data from the region by others having already been in the area or by earlier survey.

To function in both day-to-day public safety responses and in major event situations with small and large number of mobile clients 16 and varying functional requirements of different types of subscribers (e.g. police, fire, EMS) and levels of government (local, state and federal), the public safety communications network 10 of the present invention utilizes scheduling. The system 10 employs a priority system for routing and timing of all data delivery according to importance as marked by the data to be delivered. Since there is regional or state-wide coverage by PTV, there is an inherent ability to detect and address routine data traffic or high emergency level situations, whether it is selective communications for one individual or the entire state.

Data compression in the server 22 may use a patent-pending Ser. No. 09/660,013 text compression algorithm that bolts-on to existing compression technology giving at least a 1.6× compression rate advantage over current COTS-only algorithms.

Antenna and receiver diversity may be used for improving signal. A plurality of antennas and datacast receivers 19 may be used to receive data, whereby the data received in each datacast receiver 19 are used together as a group to supply a plurality of data streams to a processor. The processor may be the mobile laptop computer 17 and may be wireless for mobility. The processor laptop computer 17 may fuse good data into one stream by synchronizing in time and recognizing undamaged packets through valid packet CRC (cyclic redundancy checks). The processor laptop computer 17 may then be able to read the data addressed to it or play back the stream such as an audio or video stream.

A wireless link with TCP (transmission control protocol) may be used between the DTV receiver 19 and the laptop computer 17. In the event a wireless card is available for direct plug into the laptop computer 17, the laptop computer 17 may operate media player software that is UDP (user datagram protocol)-based for receiving streamed video information.

Certain canned voice messages or alerts broadcast by the DTV station 12a may be sent by using a short code pointer. The pointer is used to point to a WAV (audio) file in the vehicle 16 mobile laptop computer 17. The mobile laptop computer 17 then launches the WAV file and a canned voice message is heard in the vehicle 16. This system enables compression of voice and enables reduction of voice traffic of the PTV system 12 as well as the LMRS 15.

Asymmetrical communications supports cross-jurisdiction needs. All mobile clients 16 regardless of the county they are from arriving at an emergency situation can have access to a single common high-speed broadcast channel that uses PTV data-casting to all mobile clients 16 state-wide. This channel may be used to communicate and help organize disparate talk groups using various legacy LMRS 15. All legacy LMRS 15 automatically are part of the asymmetric communications system 10. For example command authority may with a single transmission to all communicate a desired frequency band use to facilitate an intra-agency communications order and to optimize spectrum use efficiency. Less time is spent finding one another over LMRS 15 and more time spent using communications for emergency task management purposes. This concept enables communications across state lines as PTV data-casting in most cases provides significant coverage over state lines.

A general or specific terrorist alert may be delivered from Department of Home Land Security or other entity having authority to do so. This alert is pushed through wired or wireless networks to digital or analog public broadcast transmitter sites where each site rebroadcasts the code state or nation wide. The signal may be received by any vehicle 16, however in particular it may be directed to aircraft. Aircraft data receivers may then demodulate the signal and code and then produce and annunciate or enable lock-outs, disable access, or enable procedures to be taken to reduce risk of life due to possible terrorist acts.

The position location system used by the mobile client 16 may also be part of an AVL (automatic vehicle location system). Integration of the position location system as part of a dual-use (AVL and FEC) system reduces the total size of the RF mobile system.

It is believed that the public safety communications network using asymmetric receive/transmit channels of the present invention and many of its attendant advantages will be understood by the foregoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. A public safety communications network using asymmetric channels for receiving requests for data from a mobile client over a narrowband channel and delivering requested data over a wideband channel to the mobile client said network comprising:
   a land mobile radio system (LMRS) for providing the narrowband channel for requesting the data;
   an emergency operations center (EOC) connected to the LMRS and for receiving and processing the data requests and forwarding the requested data;
   a terrestrially broadcast high definition digital television (DTV) station transmitter for providing the wideband channel and connected to the EOC and for delivering the requested data over the wideband channel;
   a DTV datacast receiver located with the mobile client for receiving the requested data from the terrestrially broadcast high definition DTV station transmitter; and
   a forward error correction (FEC) regulation system for use in transmitting requested data to the mobile client wherein FEC strength is regulated as a function of historical channel performance statistics for a geographical location.

2. The public safety communications network of claim 1 wherein the EOC comprises a server for providing data compression, encryption, forward error correction (FEC), addressing, and scheduling to the requested data.

3. The public safety communications network of claim 2 further comprising databases connected to the server to provide the requested data.

4. The public safety communications network of claim 1 wherein the LMRS further comprises:
   a mobile LMRS radio located with said mobile client for requesting the data over the narrowband channel;
   a computer located with the mobile LMRS radio for managing and displaying data received from the DTV datacast receiver;
   a GPS receiver located with the mobile LMRS radio for reporting position; and
   a LMRS dispatch center for receiving the data requests from the mobile LMRS radio and forwarding the requests to the EOC.

5. The public safety communications network of claim 1 wherein the DTV network comprises DTV stations, said DTV stations each comprising:
   a data multiplex insertion system for inserting the requested data into a DTV signal; and
   a RF/transmission system for terrestrially transmitting the DTV signal over the wideband channel.

6. The public safety communications network of claim 5 wherein the DTV network is a public television (PTV) network that comprises DTV stations.

7. The public safety communications network of claim 1 further comprising a wide area network (WAN) that interconnects the DTV network, the LMRS, and the EOC.

8. The public safety communications network of claim 1 further comprising an addressing system for identifying unique mobile client addresses and unique mobile client group addresses and to select a DTV station for delivering, via a terrestrial broadcast, response messages to a unique mobile client and a unique mobile client group in accordance with the addresses.

9. The public safety communications network of claim 8 wherein the DTV station is selected by using a mobile client position determined from a GPS receiver and transmitted with the request.

10. The public safety communications network of claim 1 wherein the LMRS is used to report that the requested data is received over the wideband channel from the terrestrially broadcast high definition DTV station transmitter.

11. The public safety communications network of claim 10 wherein if receipt of the requested data is negative then a retransmission of selected failed data is made with a programmable number of retries and at specified intervals until transmission is complete, on hold until a significantly later time or abandoned.

12. The public safety communications network of claim 11 wherein the location of the mobile client is determined through GPS or augmented geolocation reporting.

13. A public safety communications network using asymmetric channels for receiving requests for data from a mobile client and delivering data to the mobile client, said network comprising:
   a land mobile radio system (LMRS) for providing a narrowband channel for requesting the data;
   a terrestrially broadcast high definition DTV station transmitter for providing a wideband channel for delivering the requested data over the wideband channel; and
   a forward error correction (FEC) regulation system for use in transmitting requested data to the mobile client wherein FEC strength is regulated as a function of historical channel performance statistics for a geographical location.

14. The public safety communications network using asymmetric channels of claim 13 further comprising an emergency operations center (EOC) connected to the LMRS and for receiving and processing the data requests and forwarding the requested data, said EOC further comprising:
   a server for providing data compression, encryption, FEC, addressing, and scheduling to the requested data;
   a BER database connected to the server for storing the historical channel performance statistics for geographic locations of the mobile client; and
   map databases connected to the server to provide the geographic location data.

15. The public safety communications network using asymmetric channels of claim 13 further comprising a DTV datacast receiver located with the mobile client for receiving the requested data from the terrestrially broadcast high definition DTV station transmitter.

16. The public safety communications network using asymmetric channels of claim 13 wherein the LMRS further comprises:

a mobile LMRS radio located with said mobile client for requesting the data over the narrowband channel;
a computer located with the mobile LMRS radio for managing and displaying data received from the terrestrially broadcast high definition DTV station transmitter;
a GPS receiver located with the mobile LMRS radio for reporting position; and
a LMRS dispatch center for receiving the data requests from the mobile LMRS radio and forwarding the requests to the DTV network.

17. The public safety communications network of claim 13 wherein the terrestrially broadcast high definition DTV station transmitter comprises:
a data multiplex insertion system for inserting the requested data into a DTV signal; and
a RF/transmission system for terrestrially transmitting the DTV signal over the wideband channel.

18. The public safety communications network of claim 13 wherein the network has an addressing system for identifying unique mobile client addresses and unique mobile client group addresses and to select a terrestrially broadcast high definition DTV station transmitter for delivering response messages to a unique mobile client and a unique mobile client group in accordance with the address.

19. The public safety communications network of claim 18 wherein the terrestrially broadcast high definition DTV station transmitter is selected by using mobile client position determined from a GPS receiver and transmitted with the request.

20. A public safety communications network using asymmetric channels for receiving requests for data from a mobile client and delivering data to the mobile client, said network comprising:
a land mobile radio system (LMRS) for providing a narrowband channel for requesting the data;
terrestrially broadcast high definition DTV station transmitter for providing a wideband channel for delivering the requested data over the wideband channel, said terrestrially broadcast high definition DTV station transmitter configured for inserting the requested data into a DTV signal with a data multiplex insertion system and for transmitting the DTV signal;
a DTV datacast receiver located with the mobile client for receiving the requested data from the terrestrially broadcast high definition DTV station transmitter;
wherein the public safety communications network has an addressing system for identifying unique mobile client addresses and unique mobile client group addresses and to select a terrestrially broadcast high definition DTV station transmitter for delivering response messages to a unique mobile client and a unique mobile client group in accordance with the address; and
wherein the terrestrially broadcast high definition DTV station transmitter is selected by using mobile client position determined from a GPS receiver and transmitted with the request for data and the terrestrially broadcast high definition DTV station transmitter transmits messages to said unique mobile client with forward error correction which is regulated as a function of geographic location of said unique mobile client.

21. The public safety communications network using asymmetric channels of claim 20 further comprising an emergency operations center (EOC) connected to the LMRS and for receiving and processing the data requests and forwarding the requested data, said EOC further comprising:
a server for providing data compression, encryption, FEC, addressing, and scheduling to the requested data; and
databases connected to the server to provide the requested data.

22. The public safety communications network using asymmetric channels of claim 20 wherein the LMRS further comprises:
a mobile LMRS radio located with said mobile client for requesting the data over the narrowband channel;
a computer located with the mobile LMRS radio for managing and displaying data received from the terrestrially broadcast high definition DTV station transmitter;
a GPS receiver located with the mobile LMRS radio for reporting position; and
a LMRS dispatch center for receiving the data requests from the mobile LMRS radio and forwarding the requests to the DTV network.

23. A public safety communication system comprising:
a public safety communication center;
a first public safety vehicle with a two-way radio therein configured for providing wireless voice communication with a second public safety vehicle;
a global positioning system (GPS) receiver disposed on said first public safety vehicle and configured for determining a location of the first public safety vehicle;
a television station configured to terrestrially broadcast, to television consumers with digital television receivers, high definition digital television programming using a digital television transmitter;
a first digital television datacast receiver disposed in said first public safety vehicle, and configured to receive data downloads via a signal broadcast from said digital television transmitter;
a second digital television datacast receiver disposed in said second public safety vehicle and configured to receive data downloads via a signal broadcast from said digital television transmitter;
a first information output device disposed in said first public safety vehicle;
a second information output device disposed in said second public safety vehicle;
means for permitting said public safety communication center to broadcast an emergency graphical message to said first public safety vehicle directly, via said digital television transmitter and output a graphical message on said first information output device, without causing said graphical message to be displayed on television sets of said television consumers; and
means for altering a broadcast from said digital television transmitter in response to information from said GPS receiver so as to improve reception capabilities of graphical images at the location of said first public safety vehicle;
wherein said means for altering a broadcast utilizes a forward error correction (FEC) regulation system for use in transmitting said graphical message to the first digital television datacast receiver disposed in said first public safety vehicle wherein FEC strength is regulated as a function of historical channel performance statistics for a geographical location.

24. The system of claim 23 wherein said two-way radio is a half duplex radio.

* * * * *